United States Patent [19]
Kumashiro

[11] Patent Number: 5,784,302
[45] Date of Patent: Jul. 21, 1998

[54] HIGH SPEED POINT DEFECT DIFFUSION SIMULATING METHOD

[75] Inventor: Shigetaka Kumashiro, Tokyo, Japan

[73] Assignee: NEC Corporation, Tokyo, Japan

[21] Appl. No.: 614,404

[22] Filed: Mar. 12, 1996

[30] Foreign Application Priority Data

Mar. 13, 1995 [JP] Japan ................. 7-052382

[51] Int. Cl.$^6$ ............. G06F 9/455; H01L 21/70; H01L 21/74
[52] U.S. Cl. ............. 364/578; 364/488; 364/489
[58] Field of Search ............. 364/578, 488, 364/489

[56] References Cited

PUBLICATIONS

D. Collard et al., "IMPACT–A Point–Defect–Based Two–Dimensional Process Simulation:Modeling the Lateral Oxidation–Enhanced Diffusion of Dopants in Silicon", IEEE Trans. on Electron Devices, vol. ED–33, No. 10. pp. 1454–1462, Oct. 1986.

M. Hane et al., "A Model for Boron Short Annealing After Ion Implantation", IEEE Trans. on Electron Devices, vol 40. No. 7, pp. 1215–1222, Jul. 1993.

Michael R. Kump et al., "The Efficient Simulation of Coupled Point Defect and Impurity Diffusion", IEEE Transactions on CAD, vol. 7, No. 2, Feb. 1988, pp. 191–204.

Kenji Taniguchi et. al., "Process Modeling and Simulation: Boundary Conditions for Point Defect–Based Impurity Diffusion Model", IEEE Transactions on CAD, vol. 9, No. 11, Nov. 1990, pp. 1177–1183.

Clifford D. Maldonado et al., "A Transient Analytical Model for Predicting the Redistribution of Injected Intershtials", IEEE Transactions on CAD, vol. 9, No. 8, Aug. 1990, pp. 846–855.

Kenji Taniguichi et al., "Theoretical Model for Self–Intershtials Generation at the Si/SiO$_2$ Interface During Thermal Oxidation of Silicon," J. Appl. Phys. Apr. 1989, pp. 2723–2727.

Primary Examiner—Kevin J. Teska
Assistant Examiner—Nicole Dehlitsch-Moats
Attorney, Agent, or Firm—Laff, Whitesel, Conte & Saret, Ltd.

[57] ABSTRACT

In an interstitial concentration simulating method, a mesh is set in a simulation region of a semiconductor device. Under a condition that an area outside of the simulation region is infinite, a provisional interstitial concentration and a provisional interstitial diffusion flux at the boundary of the simulation region are calculated. Then, an interstitial diffusion rate at the boundary of the simulation region is calculated by a ratio of the provisional interstitial diffusion flux to the provisional interstitial concentration. Finally, an interstitial diffusion equation is solved for each element of the mesh using the interstitial diffusion rate at the boundary.

10 Claims, 11 Drawing Sheets

HIGH SPEED POINT DEFECT DIFFUSION SIMULATING METHOD

BACKGROUND OF THE INVENTION

1. Field of the Invention

The present invention relates to a simulating method for manufacturing a semiconductor device, and more particularly, to a method for simulating a concentration of point defects, i.e., an interstitial concentration in a semiconductor device.

2. Description of the Related Art

In a method for manufacturing a semiconductor device, when impurity ions such as boron ions are implanted into a semiconductor substrate, point defects (interstitials) such as interstitial silicon and vacancies are generated by energetic ion bombardment. The interstitials interact with the implanted impurity ions, thus enhancing the diffusion of the implanted impurity ions (see: M. Hane el at., "A Model for Boron Short Time Annealing After Ion Implantation", IEEE Transactions on Electron Devices, Vol.40, No.7, pp.1215–1222, July 1993). Therefore, when simulating an impurity diffusion process, it is necessary to simulate an interstitial diffusion process as well.

Generally, when simulating a diffusion process, a mesh is provided within a rectangular simulation region, and a discrete diffusion equation is solved for each element of the mesh. This will be explained later in detail.

On the other hand, there is a large discrepancy in diffusion length between the impurity diffusion species and the interstitial diffusion species. That is, the diffusion length of impurities such as borons is about 1 μm, while the interstitial diffusion length is about 100 μm.

In a first prior art simulating method, a large mesh for simulating the interstitial concentration are provided within a first simulation region having a depth of about 100 μm, and a small mesh for simulating the impurity concentration are provided within a second simulation region having a depth of about 1 μm within and above the first simulation region. Then, an interstitial diffusion equation is solved for each element of the mesh in the first simulation region, and an impurity diffusion equation is solved for each element of the mesh in the second simulation region. In this case, a fixed boundary condition is adopted, i.e., the interstitial concentration at a boundary of the first simulation region is always set a definite value such as zero (see: D. Collard et al., "IMPACT-A Point-Defect-Based-Two-Dimensional Process Simulator: Modeling the Lateral Oxidation-Enhanced Diffusion of Dopants in Silicon", IEEE Transactions on Electron Devices, Vol. ED-33, No. 10, pp. 1454–1462, October 1986). This will also be explained later in detail.

In the above-described first prior art simulating method, however, since the total number of elements of the mesh is large, the simulation time is increased, i.e., the simulation speed is low.

In a second prior art simulating method, a mesh is provided commonly for the impurity concentration and the interstitial concentration. That is, the mesh is provided with a simulation region having a depth of about 1 μm. In this case, a reflection type boundary condition is adopted, i.e., a gradient of the interstitial concentration at the boundary of the simulation region is zero, so that no interstitials flow through the boundary of the simulation region. Then, an impurity diffusion equation and an interstitial diffusion equation are solved for each element of the mesh in the simulation region. This will also be explained later in detail.

In the above-described second prior art simulating method, since the total number of elements of mesh is small, the simulation time is decreased, i.e., the simulation speed is high. However, since the reflection type boundary condition does not satisfy an actual physical phenomenon, the simulated interstitial concentration is far from a practical value.

SUMMARY OF THE INVENTION

It is an object of the present invention to provide a high speed point defect (interstitial) diffusion simulating method capable of obtaining an interstitial concentration close to a practical value.

According to the present invention, in an interstitial concentration simulating method, a mesh is set in a simulation region of a semiconductor device. Under a condition that an area outside of the simulation region is infinite, a provisional interstitial concentration and a provisional interstitial diffusion flux at the boundary of the simulation region are calculated. Then, an interstitial diffusion rate at the boundary of the simulation region is calculated by a ratio of the provisional interstitial diffusion flux to the provisional interstitial concentration. Finally, an interstitial diffusion equation is solved for each element of the mesh using the interstitial diffusion rate at the boundary. Although the provisional interstitial concentration and the provisional internal diffusion flux are not good approximations of the actual values, but the interstitial diffusion rate is a good approximation of actual value.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, prior art simulating methods will be explained with reference to FIGS. 1

Figure 1:
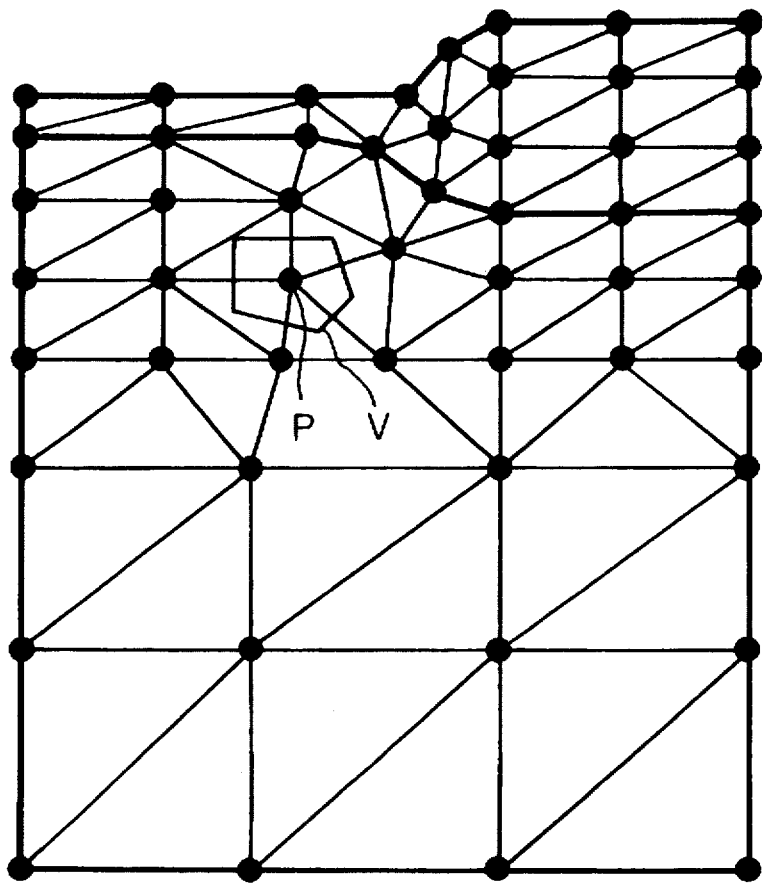
FIG. 1 is a diagram illustrating a mesh configuration provided within a semiconductor device.

In FIG. 1, which illustrates an example of a mesh configuration provided within a semiconductor device, a mesh is provided within a simulation region. Each element of the mesh is defined by a mesh point P and a control volume V.

Figure 2:
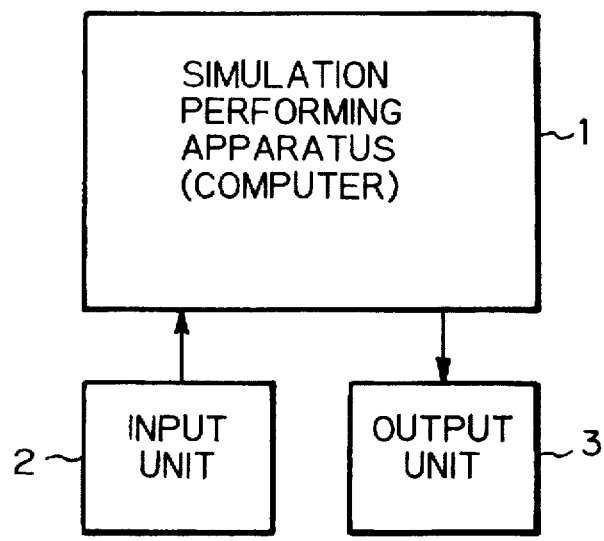
FIG. 2 is a block circuit diagram illustrating a prior art simulation system.

In FIG. 2, which illustrates a prior art simulation system, the simulation system is comprised of a simulation performing apparatus such as a computer 1, an input unit 2 for inputting simulation initial values such as a kind of ion species, ion implantation energy, a number of implanted ions per unit area and so on, and an output unit 3 for outputting a simulation result and so on. The simulation performing apparatus 1 is comprised of a central processing unit (CPU), a read-only memory (ROM), a random access memory (RAM), and the like.

Figure 3:
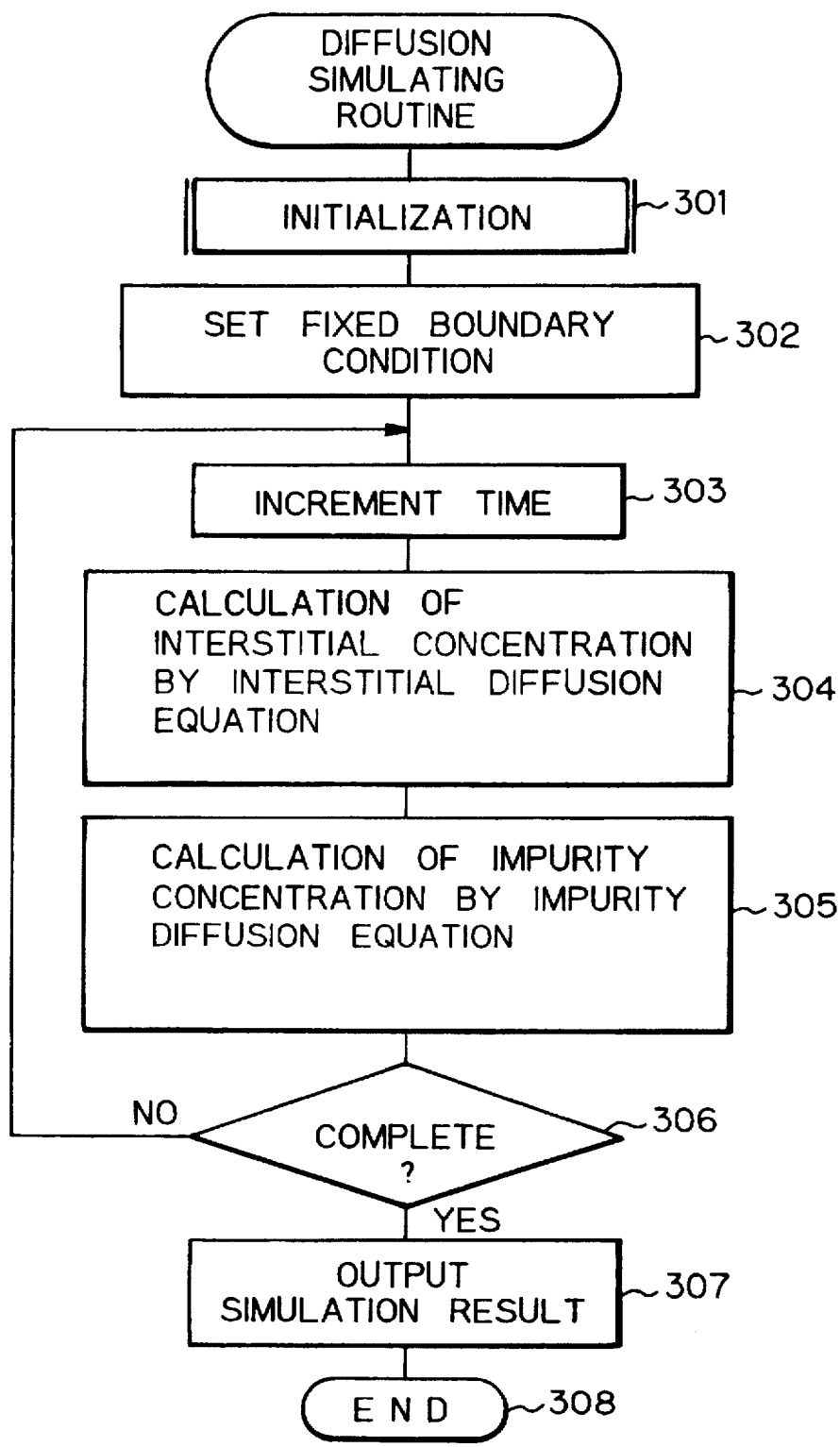
FIG. 3 is a flowchart showing a prior art simulating method.

FIG. 3 is a flowchart showing a prior art diffusion simulating method carried out by the simulation performing apparatus 1 of FIG. 2 (see the D. Collard document).

Figure 4:
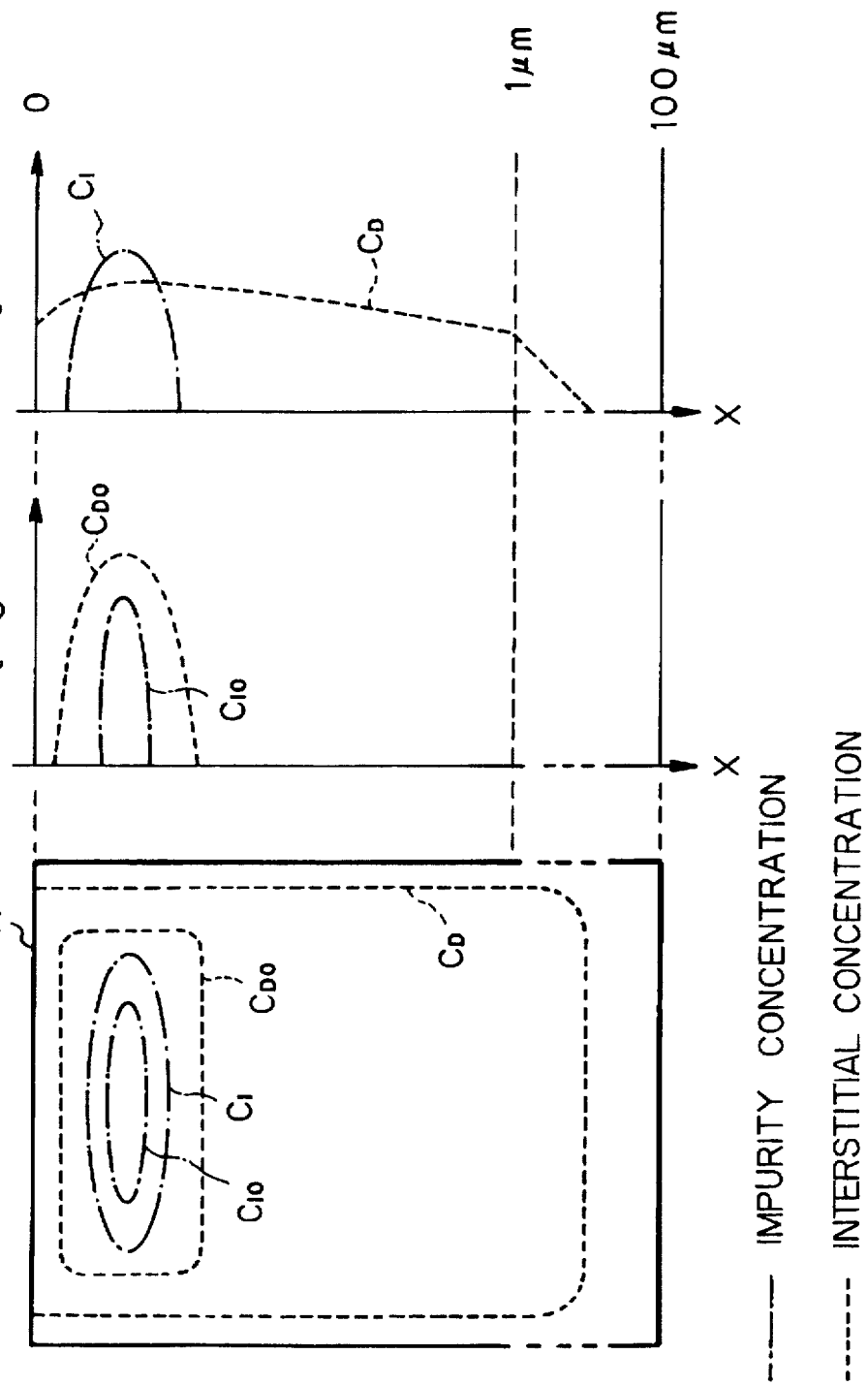
FIG. 4A is a two-dimensional diagram of the impurity concentration and the interstitial concentration obtained by the flowchart of FIG. 3.
FIG. 4B is a one-dimensional diagram of the initial impurity concentration and the initial interstitial concentration obtained by the flowchart of FIG. 3.
FIG. 4C is a one-dimensional diagram of the impurity concentration and the interstitial concentration obtained by the flowchart of FIG. 3.

First, at step 301, an initialization is carried out. That is, a simulation region R having a depth of 100 μm as shown in FIG. 4A is set, and a mesh having about 150 elements is provided within the simulation region R. Also, initial conditions such as a kind of implanted ions, ion implantation energy, a number of implanted ions per unit area and the like are inputted from the input unit 2. Then, an initial interstitial concentration $C_{D0}$ as well as an initial impurity concentration $C_{I0}$ as shown in FIGS. 4A and 4B are calculated using the Monte Carlo ion implantation simulation program in accordance with the initial conditions.

Next, at step 302, a fixed boundary condition is set. That is, the interstitial concentration $C_D$ at the depth of 100 μm is set by $$C_D(100 \; \mu m) = 0 \tag{1}$$

Next, at step 303, a predetermined time period is incremented.

Next, at step 304, an interstitial concentration $C_D$ is solved for each element of the mesh by the interstitial diffusion equation:

$$\partial C_D / \partial t = \text{div} \; D_D \; \text{grad} \; C_D \tag{2}$$

where $D_D$ is an effective diffusivity of the interstitials. As a result, at time t, the interstitial concentration $C_D$ is obtained as shown in FIGS. 4A and 4C.

Next, at step 305, an impurity concentration $C_I$ is solved for each element of the mesh by the impurity diffusion equation:

$$\partial C_I / \partial t = \text{div} \; D_I \; \text{grad} \; C_I \tag{3}$$

where $D_I$ is an effective diffusivity of the impurities which is dependent upon the impurity concentration $C_I$ as well as the interstitial concentration $C_D$. As a result, at time t, the impurity concentration $C_I$ is obtained as shown in FIGS. 4A and 4C.

Next, at step 306, it is determined whether or not a total time period has passed. If the total time period has passed, the control proceeds to step 307. Otherwise, the control returns to step 303, thus repeating the above-mentioned operations at steps 303 to 305.

Figure 5:
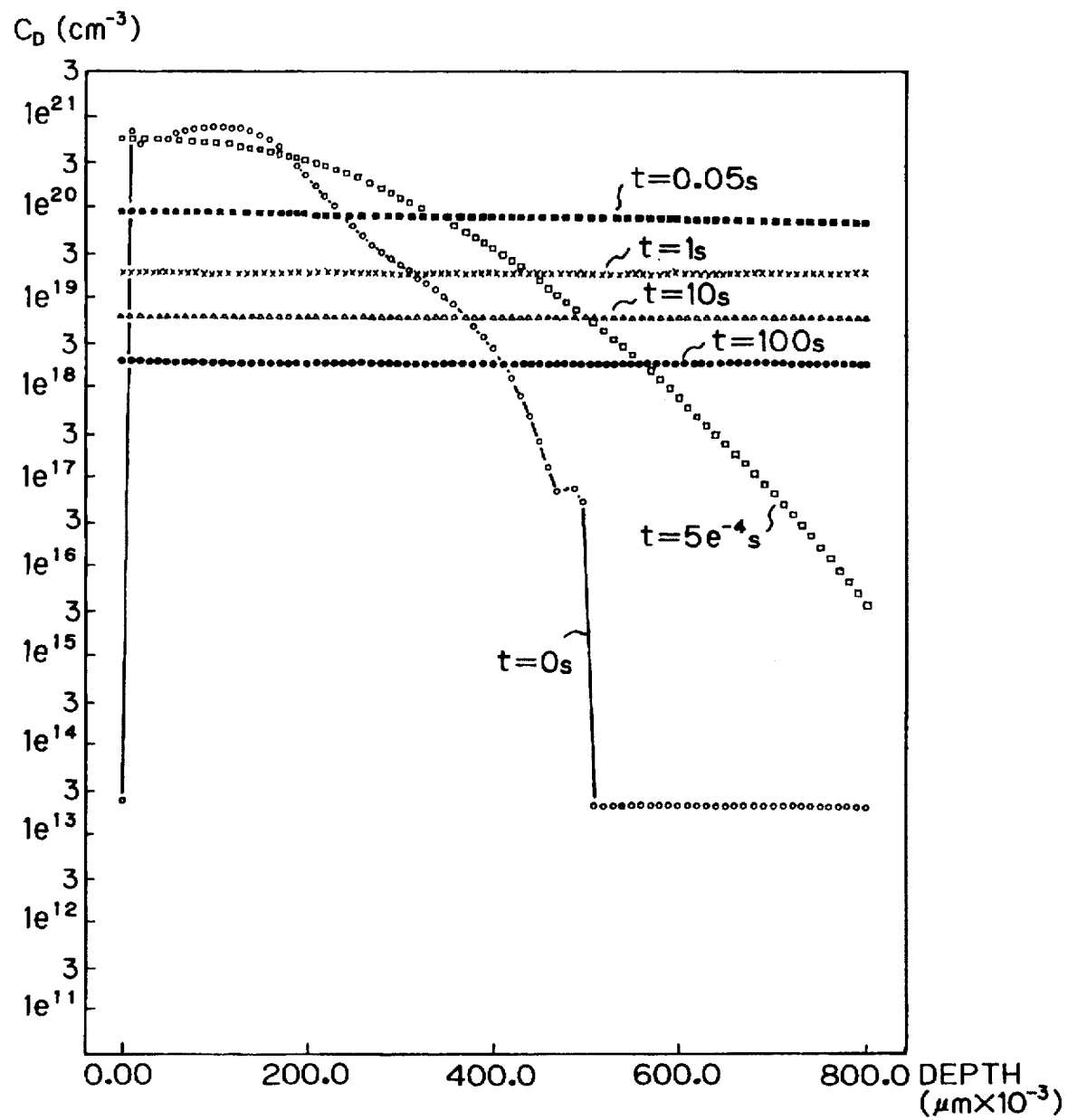
FIG. 5 is a graph showing a simulation result of the interstitial concentration obtained by the flowchart of FIG. 3.

At step 307, a simulation result is outputted to the output unit 3. For example, a simulation result of the interstitial concentration $C_D$ as shown in FIG. 5 which is close to a practical value can be obtained.

Then, the routine of FIG. 3 is completed by step 308.

In the prior art simulating method as illustrated in FIGS. 3, 4A, 4B and 4C, however, since the total number of elements of the mesh is large, the simulation time is increased, i.e., the simulation speed is low. Also, the capacity of the RAM of the apparatus of FIG. 2 for storing data for the elements of the mesh is increased.

Figure 6:
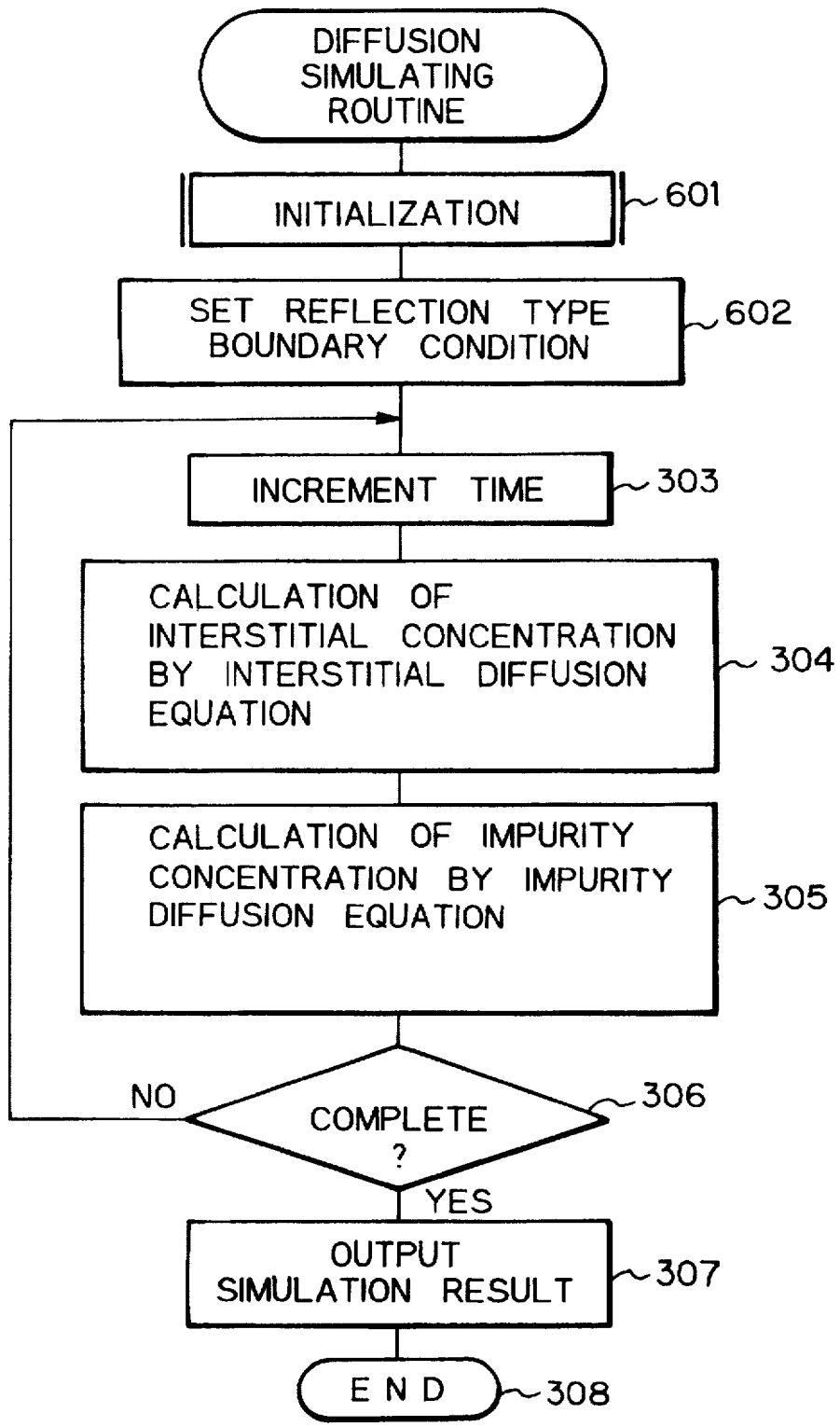
FIG. 6 is a flowchart showing another prior art simulating method.

FIG. 6 is a flowchart showing another prior art diffusion simulating method carried out by the simulation performing apparatus 1 of FIG. 2. In FIG. 6, steps 601 and 602 are provided instead of steps 301 and 302 of FIG. 3.

Figure 7:
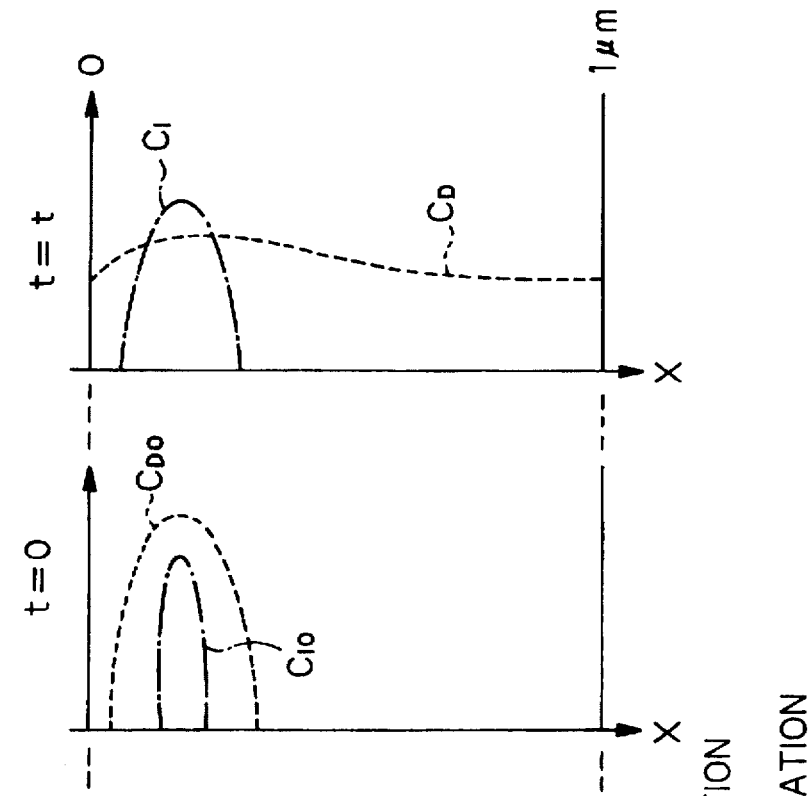
FIG. 7A is a two-dimensional diagram of the impurity concentration and the interstitial concentration obtained by the flowchart of FIG. 6.
FIG. 7B is a one-dimensional diagram of the initial impurity concentration and the initial interstitial concentration obtained by the flowchart of FIG. 6.
FIG. 7C is a one-dimensional diagram of the impurity concentration and the interstitial concentration obtained by the flowchart of FIG. 6.

First, at step 601, an initialization is carried out. That is, a simulation region R' having a depth of 1 μm as shown in FIG. 7A is set, and a mesh having about 10 elements is provided within the simulation region R'. Also, initial conditions such as a kind of implanted ions, ion implantation energy, a number of implanted ions per unit area and the like are inputted from the input unit 2. Then, an initial interstitial concentration $C_{D0}$ as well as the initial impurity concentration $C_{I0}$ as shown in FIGS. 7A and 7B are calculated using the Monte Carlo ion implantation simulation program in accordance with the initial conditions.

Next, at step 602, a reflection type boundary condition is set. That is, a slope of the interstitial concentration $C_D$ at the depth of 1 μm is set by $$\partial C_D / \partial x (1 \; \mu m) = 0 \tag{4}$$

Then, the control proceeds to step 303, thus carrying out operations at steps 303 to 307 the same as those of FIG. 3. That is, at time t, the interstitial concentration $C_D$ is obtained as shown in FIGS. 7A and 7C, and also, the impurity concentration $C_I$ is obtained as shown in FIGS. 7A and 7C.

Figure 8:
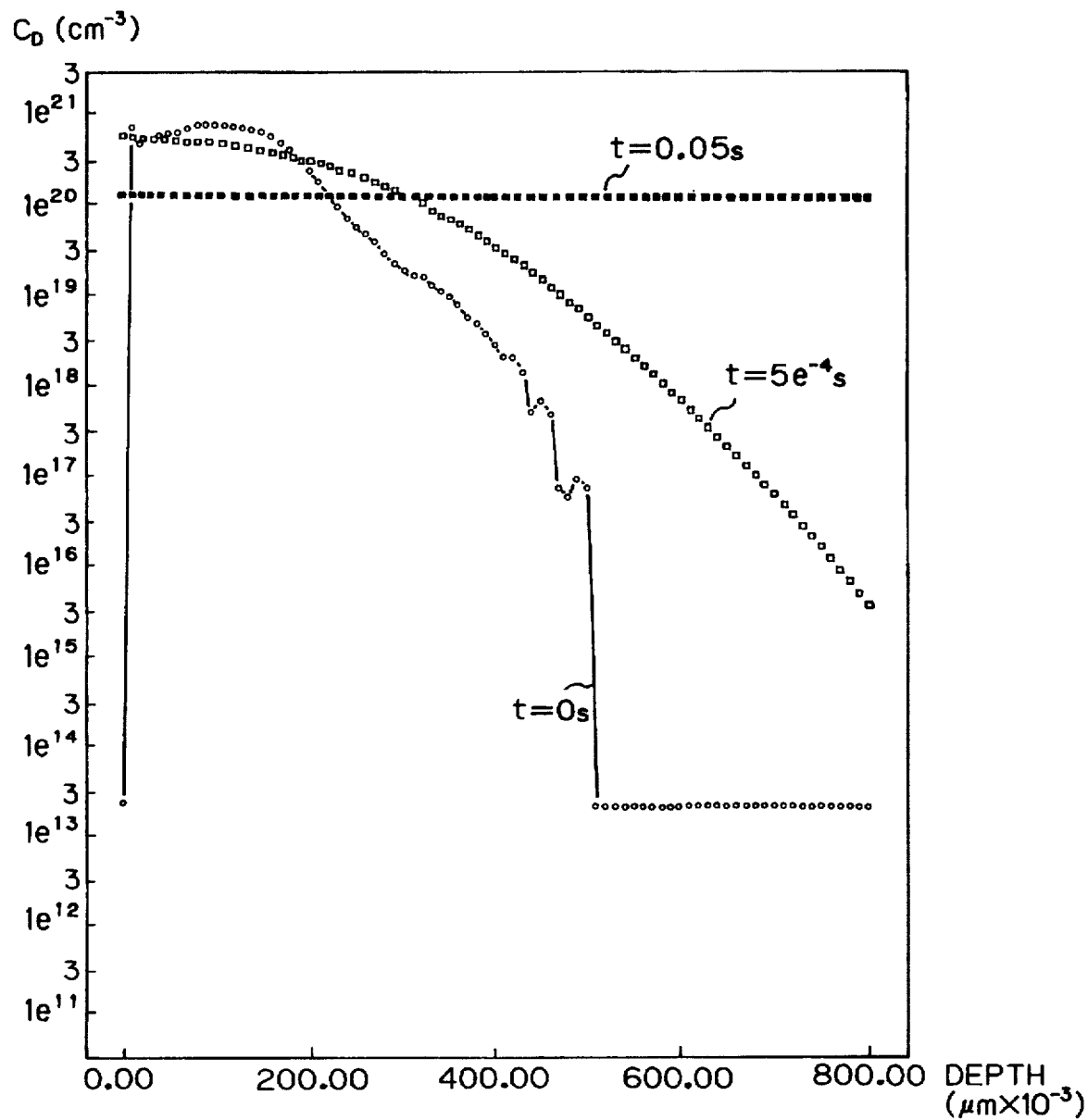
FIG. 8 is a graph showing a simulation result of the interstitial concentration obtained by the flowchart of FIG. 6.

According to the routine of FIG. 6, for example, a simulation result of the interstitial concentration $C_D$ as shown in FIG. 8 can be obtained.

In the prior art simulating method as illustrated in FIGS. 6, 7A, 7B and 7C, since the total number of elements of the mesh is small, the simulation time is decreased, i.e., the simulation speed is high. Also, the capacity of the RAM of the apparatus of FIG. 2 required for storing data for the elements of the mesh is decreased.

In the prior art simulating method as illustrated in FIGS. 6, 7A, 7B and 7C, however, since the interstitials are defined within the simulation region R' after the concentration of interstitials is homogeneous at time 0.05 s as shown in FIG. 8, the interstitial concentration $C_D$ is definite, which does not satisfy an actual physical phenomenon. Thus, the simulated interstitial concentration $C_D$ is far from a practical value.

Figure 9:
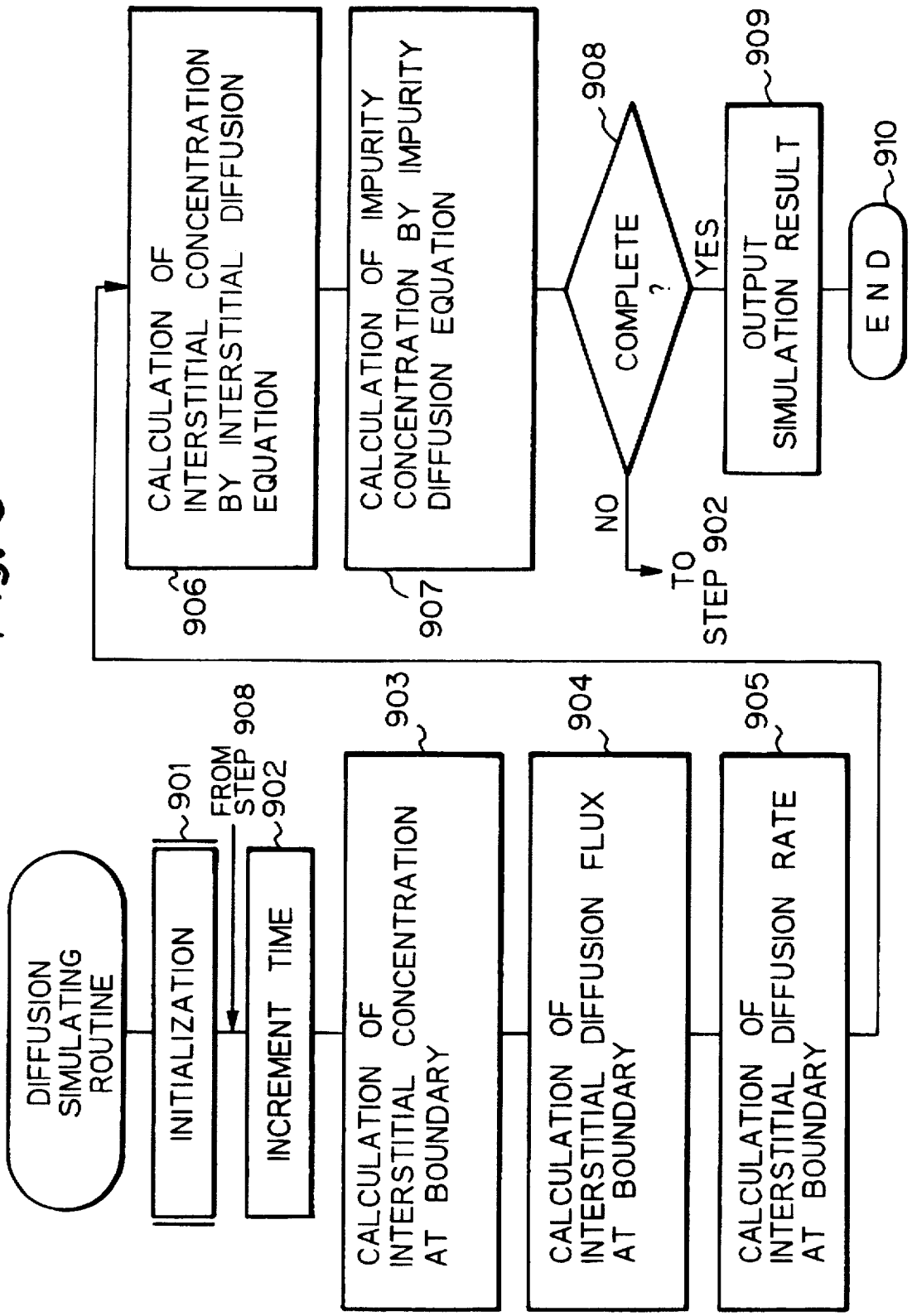
FIG. 9 is a flowchart showing an embodiment of the simulating method according to the present invention.

FIG. 9 is a flowchart showing an embodiment of the diffusion simulating method according to the present invention.

Figure 10:
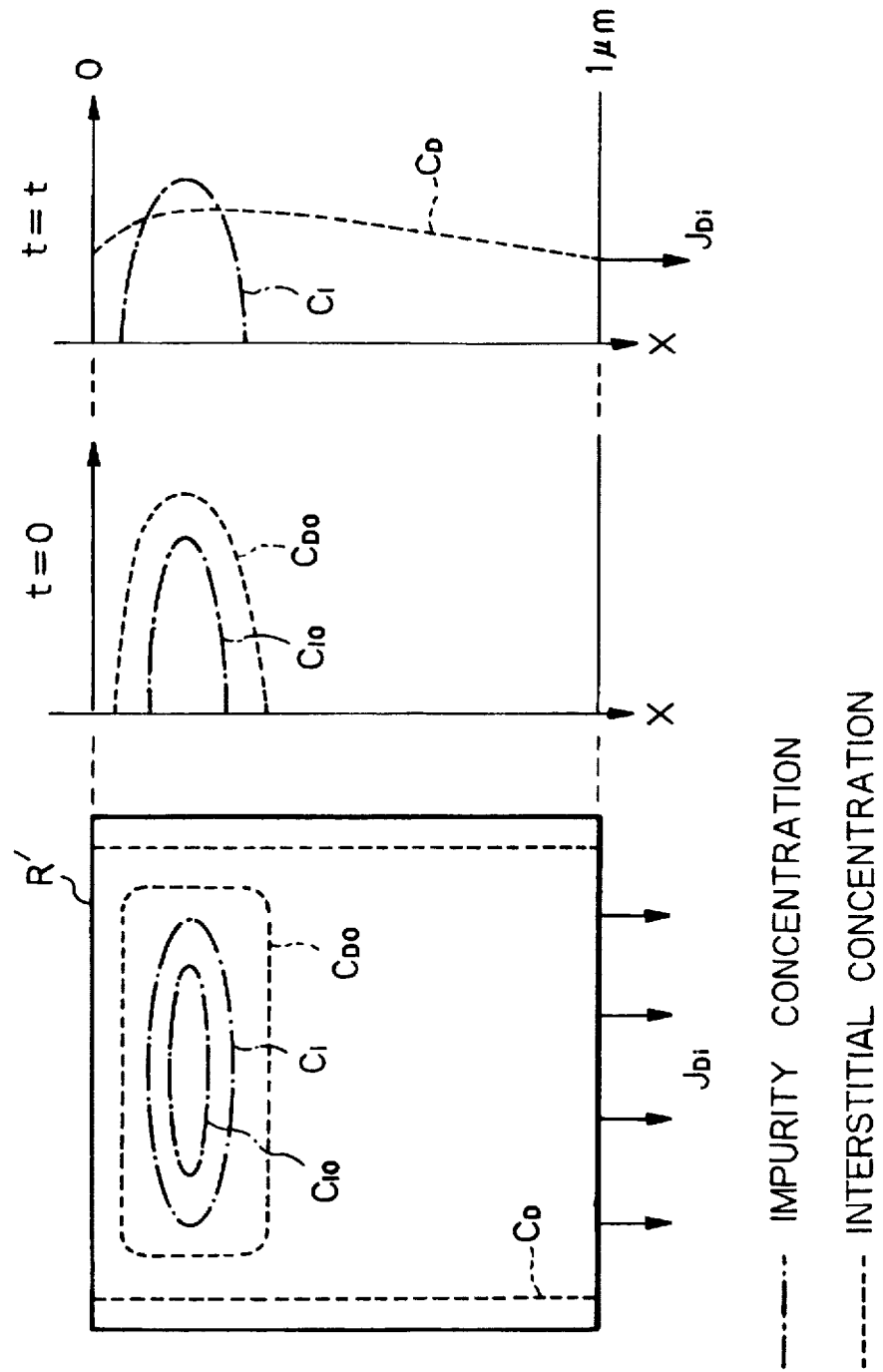
FIG. 10A is a two-dimensional diagram of the impurity concentration and the interstitial concentration obtained by the flowchart of FIG. 9.
FIG. 10B is a one-dimensional diagram of the initial impurity concentration and the initial interstitial concentration obtained by the flowchart of FIG. 9.
FIG. 10C is a one-dimensional diagram of the impurity concentration and the interstitial concentration obtained by the flowchart of FIG. 9.

First, at step 901, in the same way as at step 601, an initialization is carried out. That is, a simulation region R' having a depth of 1 μm as shown in FIG. 10A is set, and a mesh having about 10 elements is provided within the simulation region R'. Also, initial conditions such as a kind of implanted ions, ion implantation energy, a number of implanted ions per unit area and the like are inputted from the input unit 2. Then, an initial interstitial concentration $C_{D0}$ as well as an initial impurity concentration $C_{I0}$ as shown in FIGS. 10A and 10B are calculated using the Monte Carlo ion implantation simulation program in accordance with the initial conditions.

Next, at step 902, a predetermined time period is incremented.

Next, at step 903, assume that there is no obstacle outside of the simulation region R', i.e., the semiconductor substrate outside of the simulation region R' is infinite. Under thus assumption, an interstitial concentration $C_{Di}$ at location $\vec{x}$ at time t is calculated by $$C_{Di} = \int_V C_{D0}(\vec{r}) \, G_1(\vec{r}, \vec{x}, t) \, d\vec{r} \tag{5}$$

where V is the simulation region (control volume) R', and $G_1$ is a Green's function of the interstitial diffusion equation which is represented by $$G_1(\vec{r},\vec{x},t) = 1/(2\sqrt{\pi D_D t}) \cdot \exp[-|\vec{r}-\vec{x}|^2/4D_D t] \tag{6}$$

From the equation (5), the interstitial concentration $C_{Di}$ at the boundary of the simulation region R' can be calculated. However, this interstitial concentration is not a good approximation of an actual value.

Next, at step 904, also assume that there is no obstacle outside of the simulation region R', i.e., the semiconductor substrate outside of the simulation region R' is infinite. Under this assumption, an interstitial diffusion flux $J_{Di}$ at location $\vec{x}$ at time t is calculated by $$J_{Di} = (1/2t) \cdot \int (\vec{r}-\vec{x}) \cdot \vec{n} \cdot C_{D0}(\vec{r}) \cdot G(\vec{r}, \vec{x}, t) d\vec{r} \tag{7}$$

where $\vec{n}$ is a normal vector at the boundary of the simulation region R'.

From the equation (7), the interstitial diffusion flux $J_{Di}$ at the boundary of the simulation region R' can be calculated. Also, in this case, this interstitial diffusion flux is not a good approximation of an actual value.

Next, at step 905, an interstitial flow rate $V_D$ at the boundary of the simulation region R' is calculated by.

$$V_D(t) = J_D(t)/C_D(t) \tag{8}$$

Note that the inventor found that the interstitial flow rate $V_D(t)$ at the boundary by using the equations (5), (7) and (8) is a good approximation of an actual value.

Also, since each of the elements of the mesh is very small, $$\int f(\vec{r}) d\vec{r} \to \Sigma f(\vec{r}_i) Si$$

where ΣSi is a surface area of the simulation region R'.

Next, at step 906, an interstitial concentration $C_D$ is solved for each element of the mesh by the interstitial diffusion equation (2). In this case, $$(D_D \, grad \, C_d) \cdot \vec{n} = V_D(t) \cdot C_D(t)$$

As a result, at time t, the interstitial concentration $C_D$ is obtained as shown in FIGS. 10A and 10C.

Next, at step 907, an impurity concentration $C_1$ is solved for each of the elements of the mesh by the impurity diffusion equation (3).

As a result, at time t, the impurity concentration $C_1$ is obtained as shown in FIGS. 10A and 10C.

Next, at step 908, it is determined whether or not a total time period has passed. If the total time period has passed, the control proceeds to step 909. Otherwise, the control returns to step 902, thus repeating the above-mentioned operations at steps 902 to 907.

Figure 11:
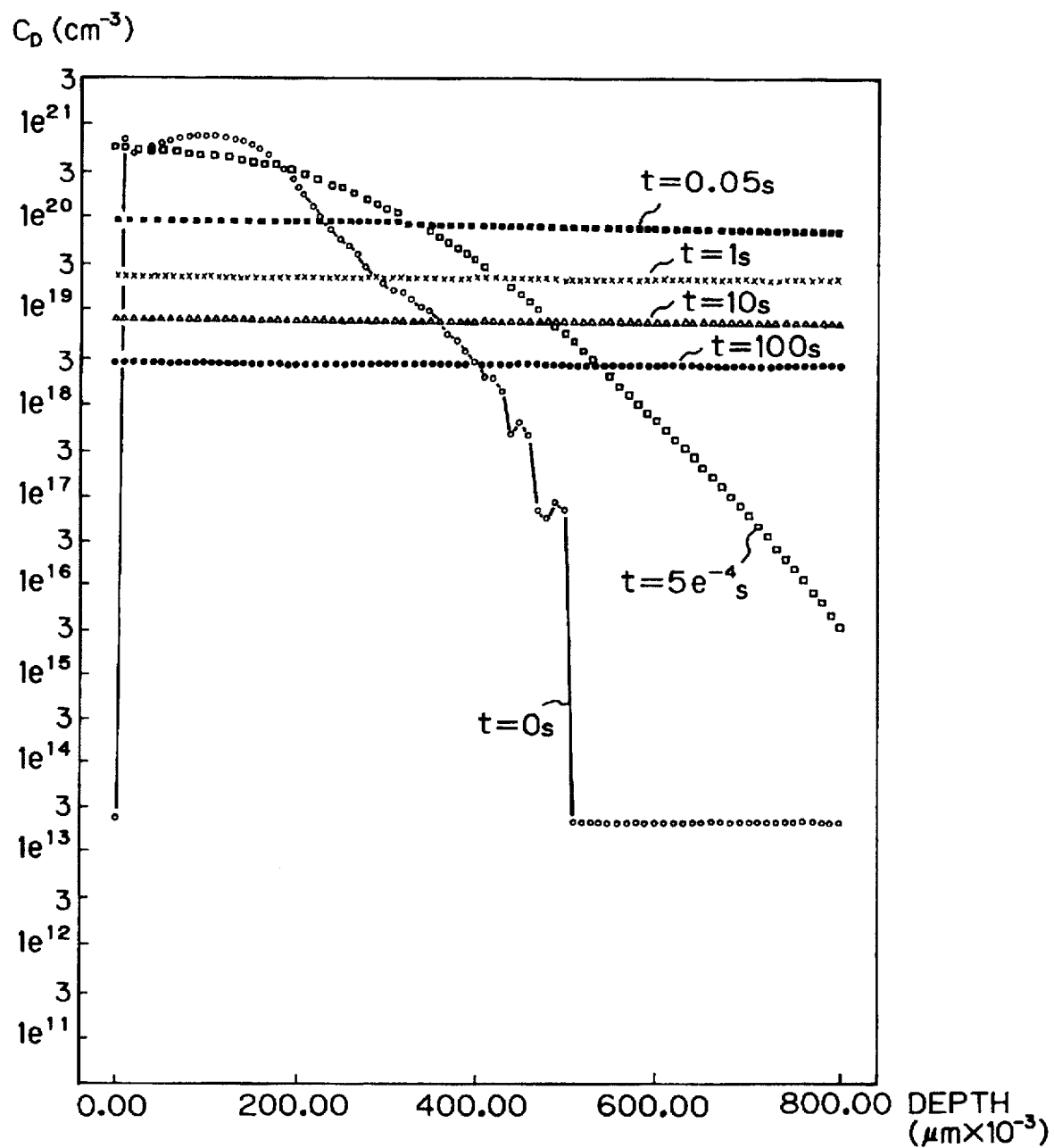
FIG. 11 is a graph showing a simulation result of the interstitial concentration obtained by the flowchart of FIG. 9.

At step 909, a simulation result is outputted to the output unit 3. For example, a simulation result of the interstitial concentration $C_D$ as shown in FIG. 11 which is close to a practical value can be obtained.

Then the routine of FIG. 9 is completed by step 910.

Thus, in the embodiment, since the total number of elements of the mesh is small, the simulation time is decreased, i.e., the simulation speed is high. Also, the capacity of the RAM of the apparatus of FIG. 2 required for storing data for the elements of the mesh is decreased.

Figure 12:
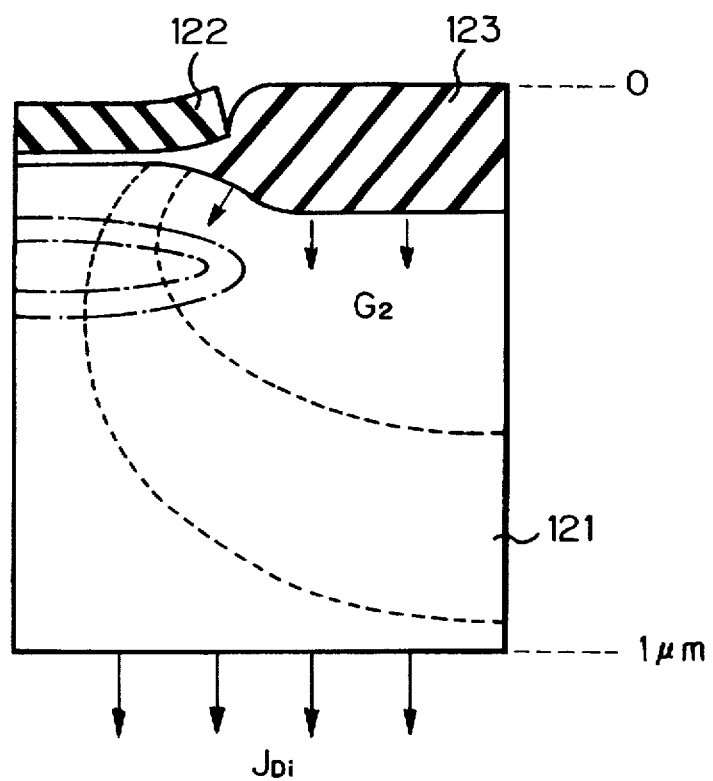
FIG. 12 is a cross-sectional view for explaining a modification of the embodiment of the present invention.

In the above-described embodiment, interstitials are generated due to energetic ion bombardment. However, as illustrated in FIG. 12, when a silicon substrate 121 is thermally oxidized using a silicon nitride layer 122 as a mask to form a silicon oxide layer 123, interstitials are generated at a Si-SiO$_2$ interface between the silicon substrate 121 and the silicon oxide layer 123. In this case, the equation (5) is replaced by $$C_{Di} = \int_L \int_0^t g(\vec{r},\tau) \, G_2(\vec{r},\vec{x},\tau,t) d\tau d\vec{r} \tag{9}$$

where L is a surface of the simulation region R';

$g(\vec{r}, \tau)$ is a generation rate of interstitials at the Si-SiO$_2$ interface; and $G_2$ is a Green's function of the interstitial diffusion equation which is represented by $$G_2(\vec{r},\vec{x},\tau,t) = 1/(2\sqrt{\pi D_D(t-\tau)}) \cdot \exp[-|\vec{r}-\vec{x}|^2/4D_D(t-\tau)] \tag{10}$$

Also, the equation (7) is replaced by $$J_{Di} = \int_L \int_0^t [1/2(t-\tau)] \cdot g(\vec{r},\tau) \cdot \tag{11}$$

$$(\vec{r}-\vec{x}) \cdot \vec{n} \cdot (\vec{r}-\vec{x}) \cdot G_2(\vec{r},\vec{x},\tau,t) d\tau d\vec{r}$$

Further, since each of the meshes is very small, $$\int_L \int_0^t f(\vec{r},\tau) d\tau d\vec{r} \to \Sigma \Sigma f(\vec{r}_i,\tau_j) \Delta t j H i$$

where ΣH$_i$=the length of the Si-SiO$_2$ interface;

ΣΔtj=,K=t(current time)

If interstitials are generated due to energitic ion bombardment and the growth of SiO$_2$, the interstitial concentration is calculated by a sum of the equations (5) and (9), and the interstitial diffusion flux is calculated by a sum of the equations (7) and (11).

Further, in FIG. 12, the Si-SiO$_2$ interface absorb the generated interstitials; however, in this case, the generation rate $g(\vec{r}, \tau)$ of the interstitials of the equation (9) is replaced by $$\alpha \cdot g(\vec{r}, \tau)$$

where $\alpha$ is an extinction rate of interstitials. In addition, if a silicon nitride layer is deposited directly on a silicon substrate, the Si-Si$_3$N$_4$ interface also generates vacancies; in this case, the vacancies can be processed in the same way as those of the Si-SiO$_2$ interface.

In the above-described embodiment, although the semiconductor substrate is made of silicon, the present invention can be applied to other semiconductor substrate made of Ge, compound semiconductor such as GaAs, InP, ZnS, Zn or Se, polycrystalline semiconductor, or amorphous semiconductor.

As explained hereinbefore, according to the present invention, since the total number of elements of a mesh can be small, the simulation time can be decreased, i.e., the simulation speed can be enhanced. Also, the capacity of memory required can be reduced.

I claim:

1. A method for simulating an interstitial concentration of a continuous semiconductor device, comprising the steps of:

setting a mesh having a plurality of elements in a simulation region within said continuous device;

calculating a first interstitial concentration at a boundary of said simulation region under a condition that an area outside of said simulation region is infinite;

calculating a first interstitial diffusion flux at the boundary of said simulation region under the condition that the area outside of said simulation region is infinite;

calculating an interstitial diffusion rate at the boundary of said simulation region by a ratio of said first interstitial diffusion flux to said first interstitial concentration; and solving an interstitial diffusion equation for each of said elements using said interstitial diffusion rate at the boundary of said simulation region to obtain said interstitial concentration.

2. The method as set forth in claim 1, wherein said first interstitial concentration calculating step comprises the steps of:

evaluating a second interstitial concentration using a product of said interstitial concentration and Green's function for each of said elements at each time;

accumulating said second interstitial concentration for all said elements to obtain said first interstitial concentration.

3. The method as set forth in claim 1, wherein said first interstitial diffusion flux calculating step comprises the steps of:

evaluating a second interstitial diffusion flux using a product of said interstitial concentration and Green's function for each of said elements at each time; and accumulating said second interstitial diffusion flux for all said elements to obtain said first interstitial diffusion flux.

4. The method as set forth in claim 1, wherein said first interstitial concentration calculating step comprises the steps of:

evaluating a second interstitial concentration using a product of a generation rate of interstitials and Green's function for each of said elements at each time; and accumulating said second interstitial concentration for all said elements to obtain said first interstitial concentration.

5. The method as set forth in claim 1, wherein said first interstitial diffusion flux calculating step comprises the steps of:

evaluating a second interstitial diffusion flux using a product of a generation rate of interstitials and Green's function for each of said elements at each time;

accumulating said second interstitial diffusion flux for all said elements to obtain said first interstitial diffusion flux.

6. A method for simulating an interstitial concentration and an impurity concentration of a continuous device, comprising the steps of:

setting a simulation region for an effective diffusion region of impurities within said continuous device;

setting a mesh having a plurality of elements in said simulation region;

calculating a first interstitial concentration at a boundary of said simulation region under a condition that an area outside of said simulation region is infinite;

calculating a first interstitial diffusion flux at the boundary of said simulation region under the condition that the outside of said simulation region is infinite;

calculating an interstitial diffusion rate at the boundary of said simulation region by a ratio of said first interstitial diffusion flux to said first interstitial concentration;

solving an interstitial diffusion equation for said elements using said interstitial diffusion rate at the boundary of said simulation region to obtain said interstitial concentration; and solving an impurity diffusion equation for said elements to obtain said impurity concentration.

7. The method as set forth in claim 6, wherein said first interstitial concentration calculating step comprises the steps of:

evaluating a second interstitial concentration using a product of said interstitial concentration and Green's function for each of said elements at each time; and accumulating said second interstitial concentration for all said elements to obtain said first interstitial concentration.

8. The method as set forth in claim 6, wherein said first interstitial diffusion flux calculating step comprises the steps of:

evaluating a second interstitial diffusion flux using a product of said interstitial concentration and Green's function for each of said elements at each time; and accumulating said second interstitial diffusion flux for all said elements to obtain said first interstitial diffusion flux.

9. The method as set forth in claim 6, wherein said first interstitial concentration calculating step comprises the steps of:

evaluating a second interstitial concentration using a product of a generation rate of interstitials and Green's function for each of said elements at each time; and accumulating said second interstitial concentration for all said elements to obtain said first interstitial concentration.

10. The method as set forth in claim 6, wherein said first interstitial diffusion flux calculating step comprises the steps of:

evaluating a second interstitial diffusion flux using a product of a generation rate of interstitials and Green's function for each of said elements at each time; and accumulating said second interstitial diffusion flux for all said elements to obtain said first interstitial diffusion flux.

* * * * *

UNITED STATES PATENT AND TRADEMARK OFFICE
CERTIFICATE OF CORRECTION

PATENT NO. : 5,784,302
DATED : July 21, 1998
INVENTOR(S) : Shigetaka Kumashiro

It is certified that error appears in the above-indentified patent and that said Letters Patent is hereby corrected as shown below:

Column 3, Line 23, insert --2, 3, 4A, 4B, 4C, 5 and 6-- after 1.

Signed and Sealed this

Twenty-fourth Day of November, 1998

Attest:

BRUCE LEHMAN

Attesting Officer                Commissioner of Patents and Trademarks